United States Patent
Tseng et al.

(10) Patent No.: US 10,522,429 B2
(45) Date of Patent: Dec. 31, 2019

(54) METHOD OF MANUFACTURING SEMICONDUCTOR DEVICE

(71) Applicant: TAIWAN SEMICONDUCTOR MANUFACTURING COMPANY LTD., Hsinchu (TW)

(72) Inventors: Lee-Chuan Tseng, New Taipei (TW); Chang-Ming Wu, New Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/088,127

(22) Filed: Apr. 1, 2016

(65) Prior Publication Data

US 2017/0154830 A1    Jun. 1, 2017

Related U.S. Application Data

(60) Provisional application No. 62/261,150, filed on Nov. 30, 2015.

(51) Int. Cl.
*H01L 21/66*      (2006.01)
*B81C 99/00*      (2010.01)
(Continued)

(52) U.S. Cl.
CPC .......... *H01L 22/26* (2013.01); *B81C 1/00587* (2013.01); *B81C 99/004* (2013.01);
(Continued)

(58) Field of Classification Search
CPC ............... H01L 22/26; H01L 21/30655; B81C 1/00587; B81C 2201/0132; B81C 99/004;
(Continued)

(56) References Cited

U.S. PATENT DOCUMENTS

| | | | |
|---|---|---|---|
| 5,501,893 A | * | 3/1996 | Laermer ............ H01L 21/3065 216/67 |
| 5,565,114 A | | 10/1996 | Saito et al. |

(Continued)

FOREIGN PATENT DOCUMENTS

| | | |
|---|---|---|
| CN | 1739185 A | 2/2006 |
| CN | 1784778 A | 6/2006 |

(Continued)

*Primary Examiner* — Anita K Alanko
(74) *Attorney, Agent, or Firm* — Haynes and Boone, LLP

(57) ABSTRACT

A method of manufacturing a semiconductor device is provided. The method includes the following operations. (a) A substrate is patterned. (b) A polymer layer is formed on the patterned substrate. (c) The polymer layer is patterned. Steps (a), (b) and (c) are repeated alternatingly. An intensity of an emission light generated by a reaction of a plasma and a product produced in steps (a), (b) and (c) is detected. An endpoint in patterning the substrate is determined according to the intensity of the emission light generated by the reaction of the plasma and the product produced in only one step of steps (a), (b) and (c). A sampling rate of the intensity is ranged from 1 pt/20 ms to 1 pt/100 ms. A smooth function is used to process the intensity of the emission light generated by the reaction of the plasma and the product.

20 Claims, 15 Drawing Sheets

(51) Int. Cl.
  *B81C 1/00* (2006.01)
  *H01L 21/3065* (2006.01)
  *H01J 37/32* (2006.01)

(52) U.S. Cl.
  CPC .. *H01J 37/32972* (2013.01); *H01L 21/30655* (2013.01); *B81B 2203/033* (2013.01); *B81C 2201/0112* (2013.01); *B81C 2201/0132* (2013.01); *H01J 37/32963* (2013.01)

(58) Field of Classification Search
  CPC ........ B81C 2201/0112; H01J 37/32963; H01J 37/32972; B81B 2203/033
  See application file for complete search history.

(56) References Cited

U.S. PATENT DOCUMENTS

| | | | | |
|---|---|---|---|---|
| 6,084,257 | A * | 7/2000 | Petersen | G01P 15/0802 |
| | | | | 200/329 |
| 6,916,746 | B1 * | 7/2005 | Hudson | H01L 21/31116 |
| | | | | 216/58 |
| 7,053,994 | B2 | 5/2006 | McMillin et al. | |
| 8,461,052 | B2 * | 6/2013 | Oohara | H01J 37/321 |
| | | | | 438/706 |
| 2004/0065932 | A1 * | 4/2004 | Reichenbach | B81C 1/00293 |
| | | | | 257/415 |
| 2004/0175913 | A1 * | 9/2004 | Johnson | H01J 37/32963 |
| | | | | 438/610 |
| 2004/0238489 | A1 * | 12/2004 | Johnson | B81C 1/00587 |
| | | | | 216/60 |
| 2006/0048891 | A1 | 3/2006 | Yue et al. | |
| 2006/0087644 | A1 | 4/2006 | McMillin et al. | |
| 2008/0230510 | A1 | 9/2008 | Appleyard et al. | |
| 2011/0244686 | A1 * | 10/2011 | Aso | H01L 21/76898 |
| | | | | 438/694 |
| 2011/0244687 | A1 | 10/2011 | Oohara et al. | |
| 2012/0220135 | A1 * | 8/2012 | Nakagawa | H01L 21/31144 |
| | | | | 438/714 |
| 2012/0270404 | A1 * | 10/2012 | Bajaj | H01L 21/30655 |
| | | | | 438/700 |
| 2012/0282715 | A1 | 11/2012 | Terasaki et al. | |
| 2014/0264770 | A1 * | 9/2014 | Okandan | H01L 21/78 |
| | | | | 257/620 |
| 2015/0129991 | A1 | 5/2015 | Lee et al. | |
| 2016/0111261 | A1 * | 4/2016 | Kabouzi | H01J 37/32963 |
| | | | | 438/10 |

FOREIGN PATENT DOCUMENTS

| | | |
|---|---|---|
| CN | 1898547 A | 1/2007 |
| CN | 101006550 A | 7/2007 |
| CN | 101233072 A | 7/2008 |
| CN | 102741155 A | 10/2012 |
| CN | 103178240 A | 6/2013 |
| TW | 334170 | 6/1998 |
| TW | I248644 | 2/2006 |

* cited by examiner

METHOD OF MANUFACTURING SEMICONDUCTOR DEVICE

CROSS-REFERENCE TO RELATED APPLICATION

This application claims priority of U.S. provisional application Ser. No. 62/261,150 filed on 2015 Nov. 30, which is incorporated by reference in its entirety.

BACKGROUND

In recent years, the Micro-Electro-Mechanical System (MEMS) market and other areas of semiconductor processing have had a rapid growth. The fabrication of MEMS evolved from the process technology in semiconductor device fabrication, including deposition processes, etching processes, and other technologies capable of manufacturing small devices.

One of those technologies, a Bosch process, is widely used to achieve extremely high aspect ratio and high etch rate etching of silicon microstructures used throughout the MEMS industry. The Bosch process is a switched process characterized by alternating steps of silicon etch, polymer deposition, and polymer break through. This process is cycled until the required etch depth is achieved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
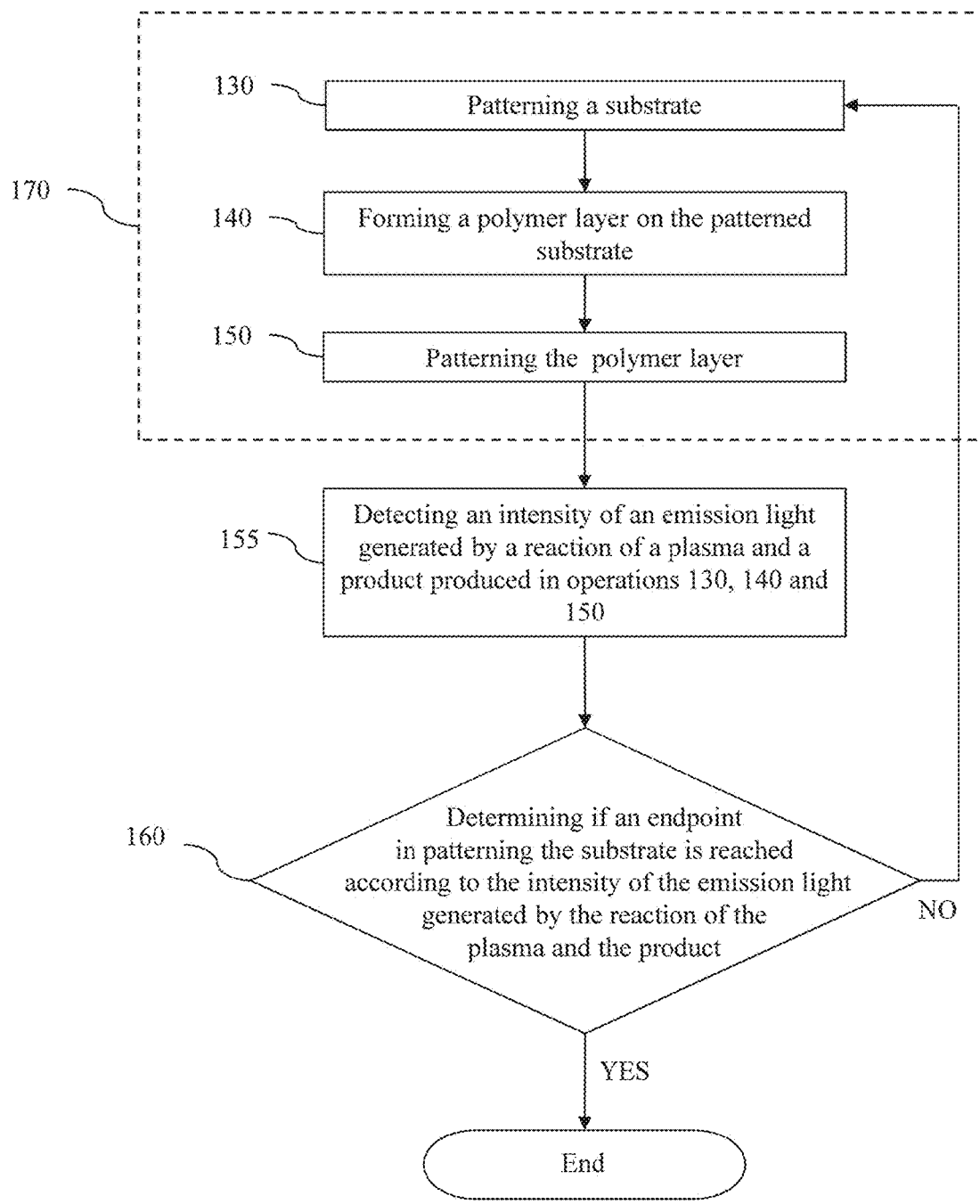
FIG. 1 is a flow chart illustrating a method for manufacturing a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the term "semiconductor device" may relate to a recess, trench, cavity, opening, or hole formed in a structural layer or substrate.

In the present disclosure, the term "trench" is not limited to a long, narrow ditch as it generally used for definition. The term "trench" is construed broadly to include a rectangular hole shaped not so long and narrow, a square hole, a rounded hole, or a polygonal-shaped hole, all of which are contemplated as being a "trench" for the purposes of this disclosure.

In the present disclosure, the term "endpoint" may relate to a point when a substrate or a structural layer is etched to a desired depth. In some embodiments, the endpoint is determined when the substrate or the structural layer is etched through. In some alternative embodiments, the endpoint is determined when one of two structural layers is etched to expose an interface between these two structural layers.

FIG. 1 is a flow chart illustrating a method for manufacturing a semiconductor device according to various aspects of the present disclosure. The method 100 is able to be applied to pattern a substrate or a structural layer. In some embodiments, the substrate or the structural layer is covered by a mask layer such as a photoresist layer or a hard mask layer having an opening exposing a portion of the substrate or the structural layer. The method 100 begins with operation 170 (i.e., a Bosch process) which includes operations 130, 140 and 150. In operation 130, the substrate is patterned. For example, the substrate is etched using the mask layer as a hard mask in order to form a trench. In operation 140, a polymer layer is formed. For example, the polymer layer is deposited on a sidewall and a bottom surface of the trench. In operation 150, the polymer layer is patterned. For example, the polymer layer deposited on the bottom surface of the trench is patterned, e.g., the polymer layer is broken through. The method 100 proceeds with operation 155 to detect an intensity of an emission light generated by a reaction of a plasma and a product produced in operations 130, 140 and 150. The method 100 continues with operation 160 to determine if an endpoint in patterning the substrate is reached according to the intensity of the emission light generated by the reaction of the plasma and the product. If the endpoint is not determined, the method 100 continues with operation 170 again until the required etch depth is reached.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-2E and 3A-3E which are cross-sectional views of the semiconductor device in various stages of a manufacturing process.

Figure 2A:
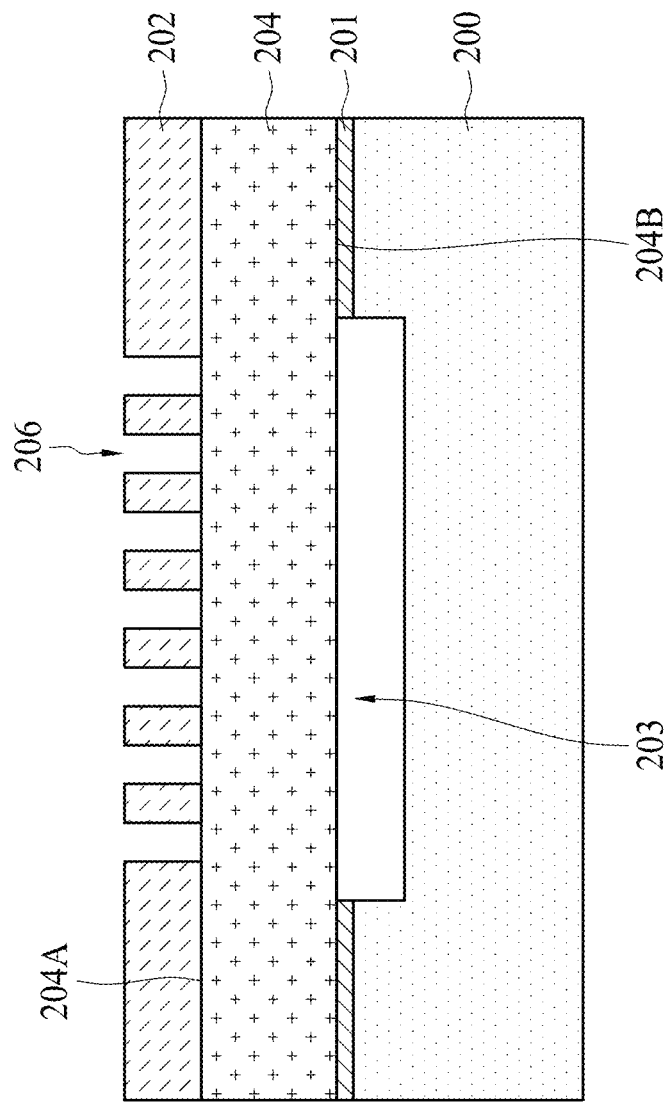
FIGS. 2A to 2E are cross-sectional views at one of various operations of manufacturing a trench structure according to some embodiments of the present disclosure.

FIGS. 2A to 2E are cross-sectional views at one of various operations of manufacturing a trench structure according to some embodiments of the present disclosure. As depicted in FIG. 2A, a substrate 204 is provided. The substrate 204 described herein includes a wafer over which devices such as semiconductor devices, MEMS devices, or other devices are to be formed. In some embodiments, the substrate 204 may include a semiconductor substrate, such as a bulk semiconductor substrate. The bulk semiconductor substrate includes an elementary semiconductor, such as silicon and/or germanium; a suitable compound semiconductor, such as silicon carbide, gallium arsenic, gallium phosphide, indium phosphide, indium arsenide, and/or indium antimonide; a suitable alloy semiconductor, such as silicon germanium, silicon germanium carbide, gallium arsenic phosphide, and/or gallium indium phosphide; or combinations thereof. In some embodiments, the substrate 204 may include a multi-layered substrate, such as a silicon-on-insulator (501) substrate.

In some embodiments, a second surface 204B of the substrate 204 is attached to a carrier substrate 200. The carrier substrate 200 may include a wafer or a substrate configured as a carrier or a supporter to carry, support or handle the substrate 204 during delivery or fabrication. The dimension, material or characteristics of the carrier substrate 200 and those of the substrate 204 may be the same or different. The substrate 204 and the carrier substrate 200 may be bonded by any other suitable direct or indirect bonding techniques. In some embodiments, an intermediate layer 201 such as an adhesive layer is used to attach the substrate 204 and the carrier substrate 200. In some embodiments, a recess 203 is between the substrate 204 and the carrier substrate 200, so that a portion of the substrate 204 is suspended from the carrier substrate 200. In some embodiments, the recess 203 may be sealed by the substrate 204 and the carrier substrate 200. In some embodiments, the carrier substrate 200 is configured to prevent cooling gas, such as helium or nitrogen, from entering the recess 203 and interfering with the detection of an endpoint when the substrate 204 is etched through.

As depicted in FIG. 2A, a mask layer 202 with openings 206 is formed over the substrate 204. The mask layer 202 may be formed by using any of a variety of deposition operations such as coating operation, physical vapor deposition (PVD) operation, chemical vapor deposition (CVD) operation, atomic layer deposition (ALD) operation, or any other suitable operations followed by a patterning process to form the openings 206. A portion of a first surface 204A of the substrate 204 is exposed from the openings 206 of the mask layer 202. In some embodiments, the mask layer 202 may be formed of a patterned photoresist layer. In some other embodiments, the mask layer 202 may be a patterned oxide layer, a patterned nitride layer, or any other type of hard mask suitable for the subsequent Bosch process.

Figure 2B:
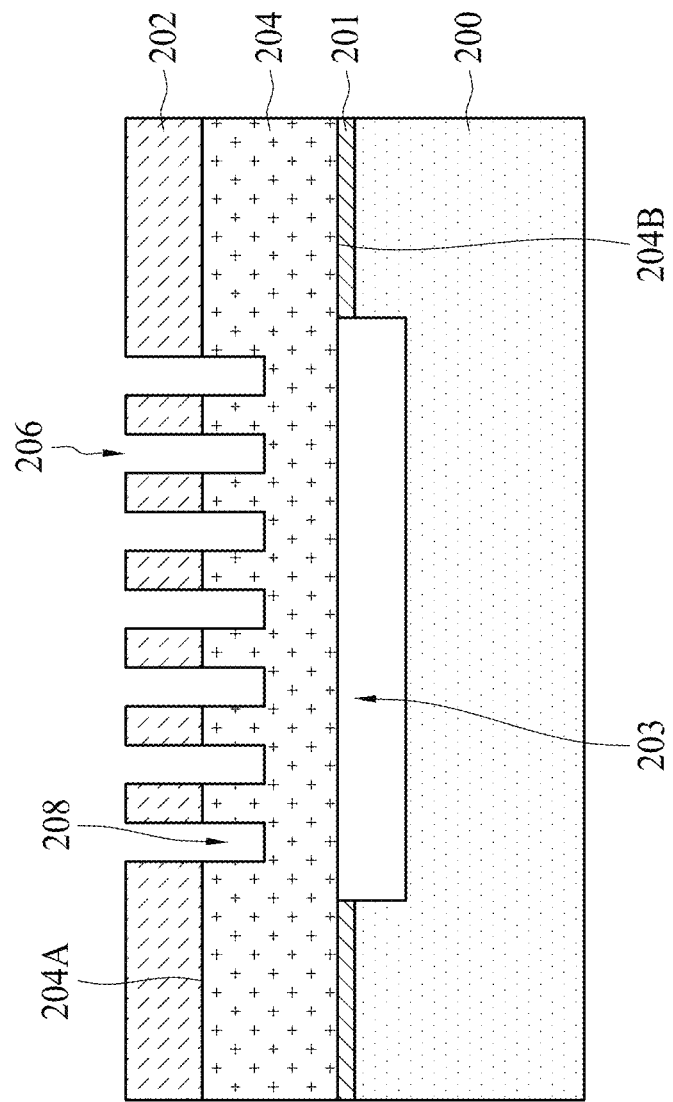

As depicted in FIG. 2B and operation 130 in FIG. 1, the method 100 begins with operation 130 in which the substrate 204 is patterned. In some embodiments, the substrate 204 is etched through the openings 206 of the mask layer 202 to form trenches 208 in the substrate 204. The trenches 208 are formed by recessing the first surface 204A of the substrate 204 exposed from the openings 206 of the mask layer 202. In some embodiments, a fluorine-based (F-based) reactive gas is introduced in a chamber in operation 130 to implement an etch process. By way of example, sulfur hexafluoride ($SF_6$) gas is provided as the F-based reactive gas for etching the substrate 204 formed of silicon. In some embodiments, other suitable gases such as argon, oxygen, and/or helium may also be introduced. In operation 130, a plasma treatment is performed to generate $SF_6$ plasma comprising F-based radicals, ions and electrons. The F-based radicals reach the substrate 204 through the openings 206 formed in the mask layer 202 and react with the material of the substrate 204. Thus, trenches 208 are formed in the substrate 204.

Figure 2C:
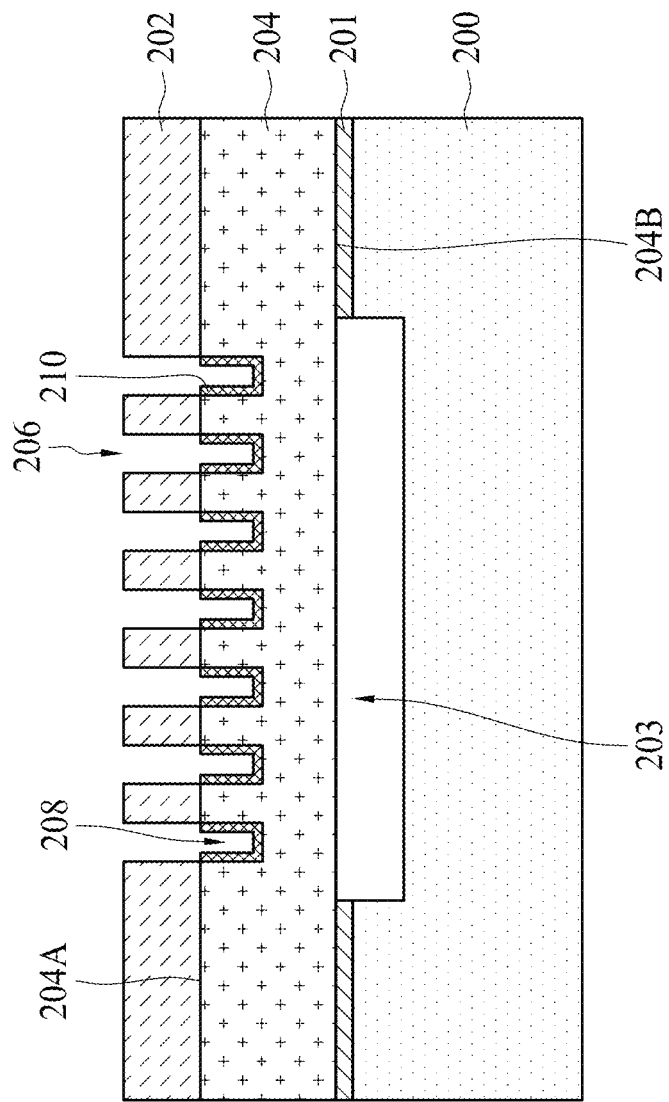

As depicted in FIG. 2C and operation 140 in FIG. 1, the method 100 continues with operation 140 in which a polymer layer 210 is formed on the patterned substrate 204. For example, the polymer layer 210 is deposited on a sidewall and a bottom surface of the trench 208. In some embodiments, a fluorocarbon-based gas is introduced in the chamber in operation 130 to form the polymer layer 210. By way of example, octafluorocyclobutane ($C_4F_8$) gas is provided for deposition. In some embodiments, other suitable gases such as argon, oxygen, and/or helium may also be introduced. In operation 140, a plasma treatment is performed to decompose the $C_4F_8$ gas, and then fluorocarbon-based polymers are generated from $C_4F_8$ plasma. Those fluorocarbon-based polymers are deposited to form the polymer layer 210 on a sidewall and a bottom surface of the trench 208.

Figure 2D:
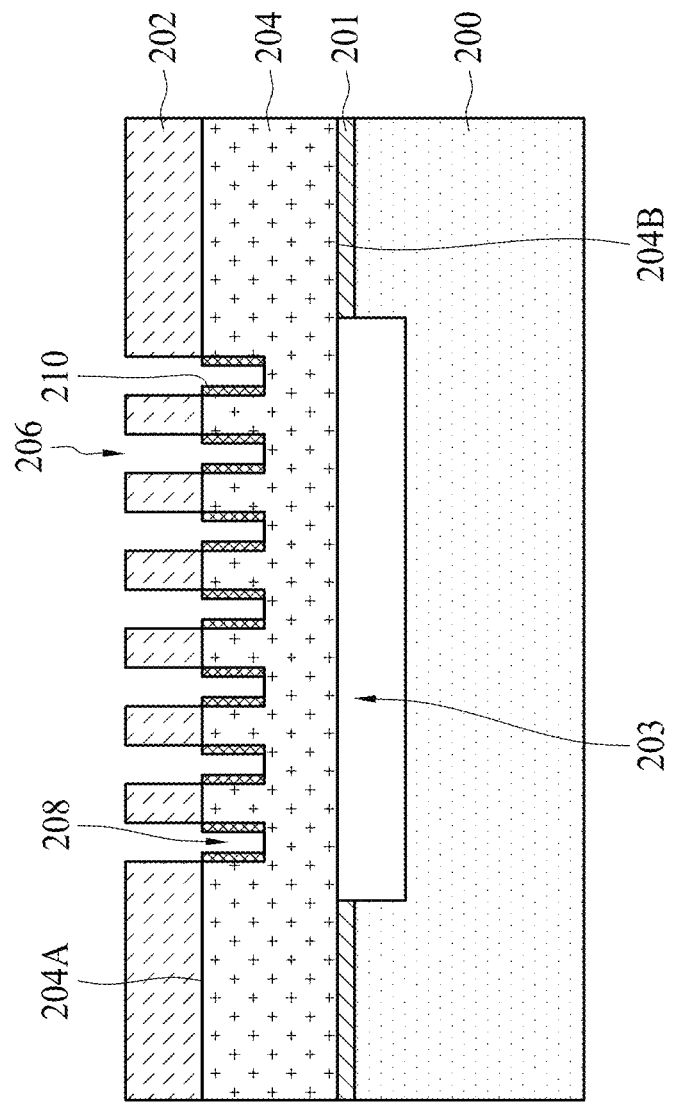

As depicted in FIG. 2D and operation 140 in FIG. 1, the method 100 continues with operation 150 in which the polymer layer 210 is patterned. For example, the polymer layer 210 deposited on the bottom surface of the trench 208 is broken through by providing an F-based reactive gas again. By way of example, sulfur hexafluoride ($SF_6$) gas is used as an F-based reactive gas. In some embodiments, other suitable gases such as argon, oxygen, and/or helium may be introduced. Similar to operation 130, a plasma treatment is performed to generate $SF_6$ plasma comprising F-based radicals, ions and electrons. In some embodiments, Self-bias is applied to accelerate ions toward the bottom of the trench 208 so that a portion of the polymer layer 210 formed on the bottom trench surface is selectively removed prior to the following operation 130. In some embodiments, at least a portion of the polymer layer 210 residing on the sidewall of the trench 208 is reserved so that the perimeter of the trench 208 is protected without being enlarged.

In some embodiments, exemplary process conditions of operations 130, 140 and 150 are illustrated as follows. Gas flow rate: between about 10 sccm and about 1000 sccm; Plasma power: from approximately 100 watts to approximately 5000 watts; Process pressure: between approximately 5 mTorr and approximately 500 mTorr. Each process condition in operations 130, 140 and 150 may be the same with or different from one another. In some embodiments, the self-bias in operation 150 is higher than that in operation 130, but not limited thereto. Other process conditions may also be used.

Figure 2E:
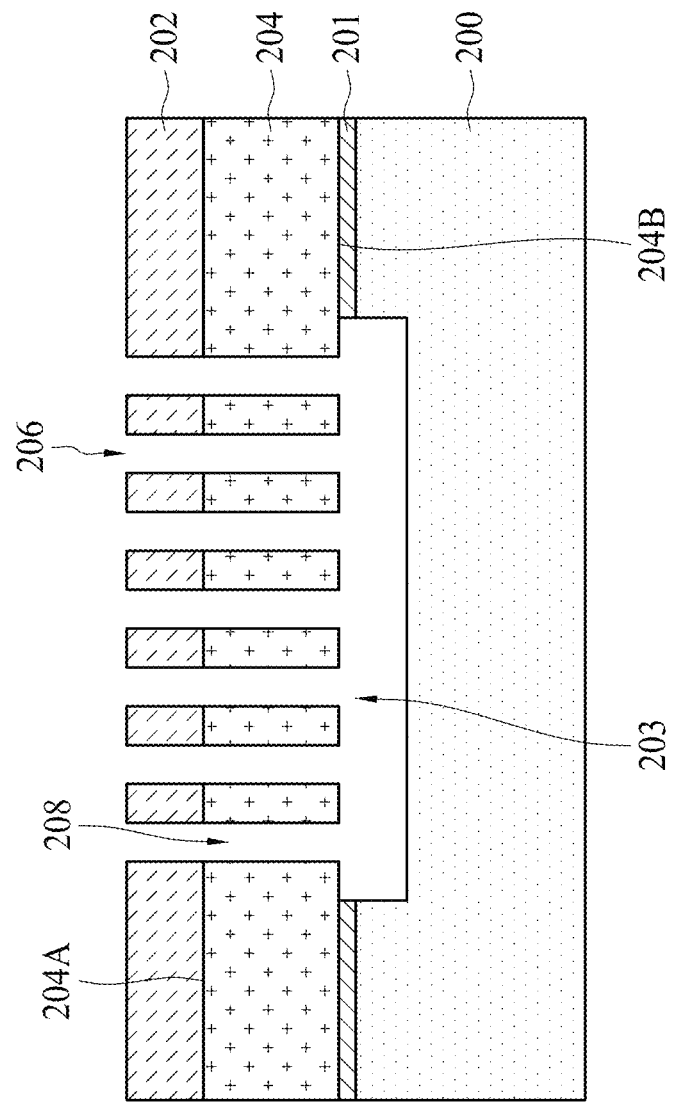
Figure 3A:
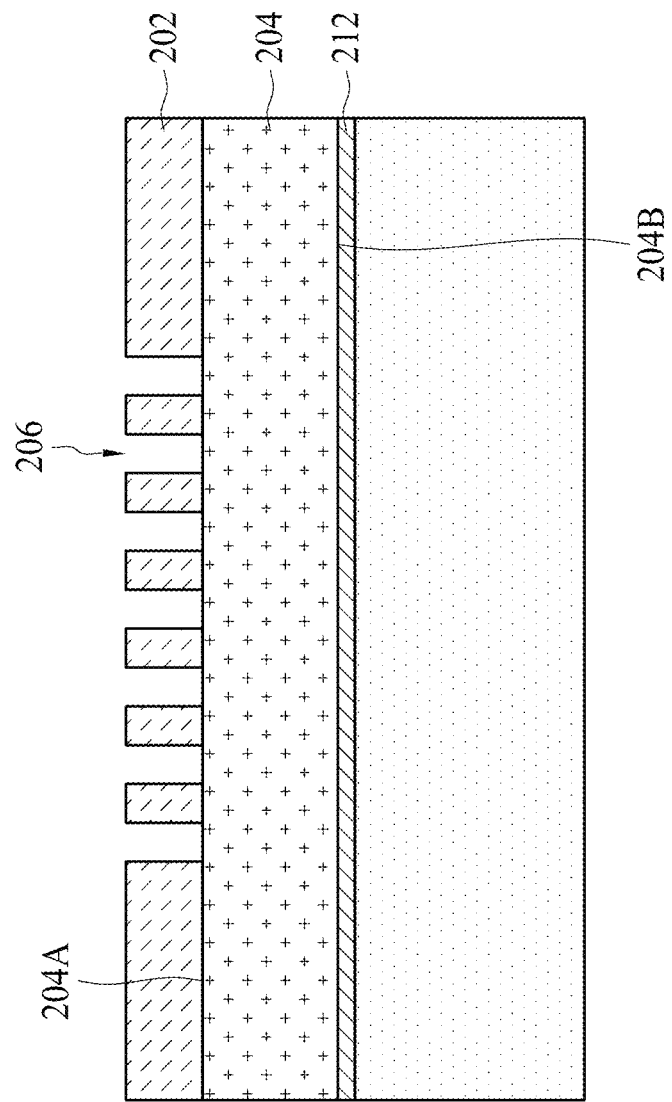
FIGS. 3A to 3E are cross-sectional views at one of various operations of manufacturing a trench structure according to some embodiments of the present disclosure.
Figure 3B:
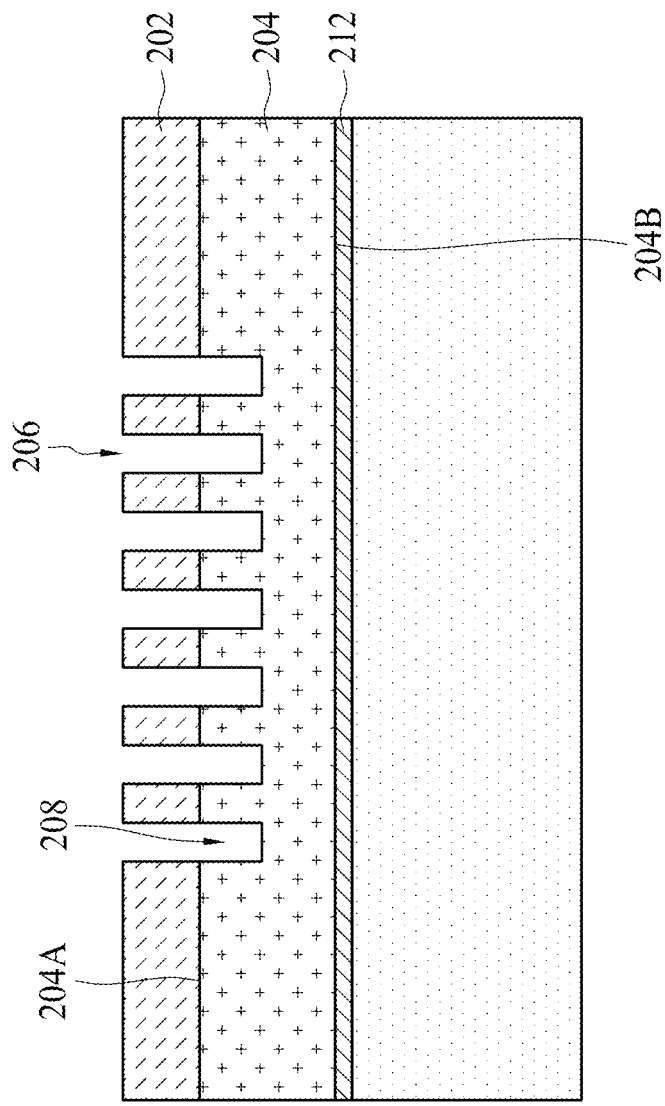
Figure 3C:
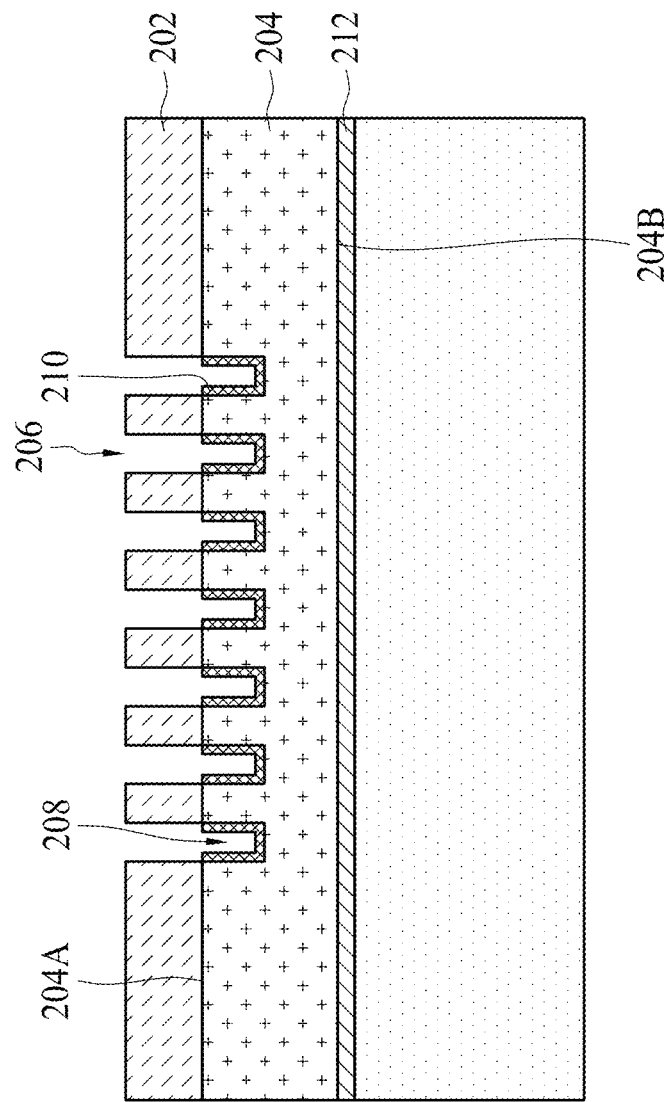
Figure 3D:
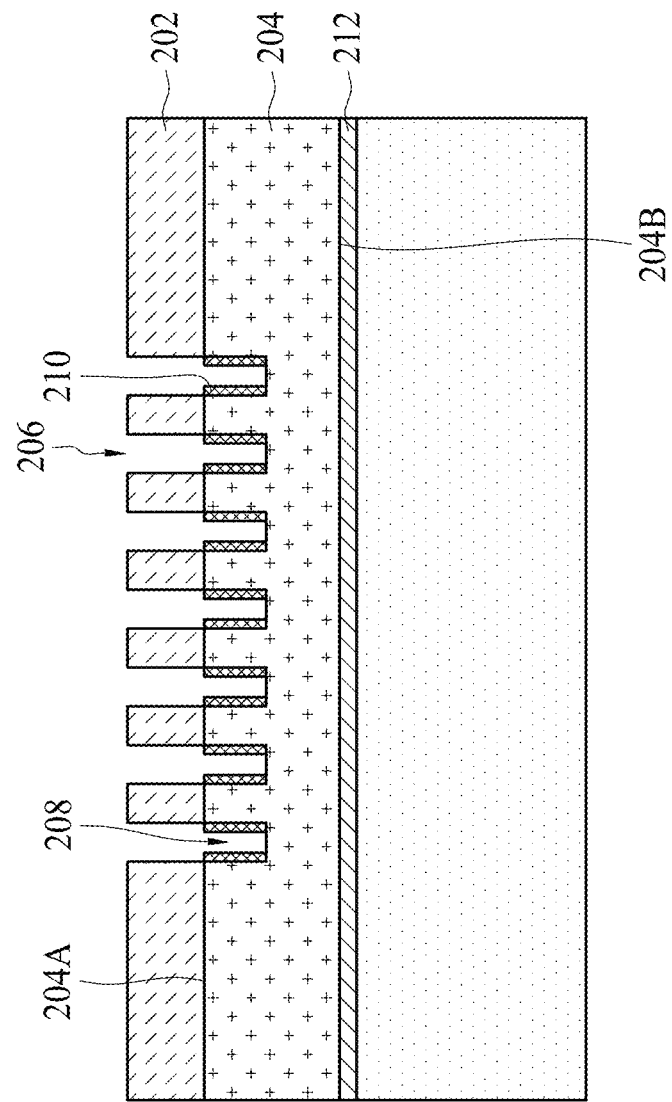
Figure 3E:
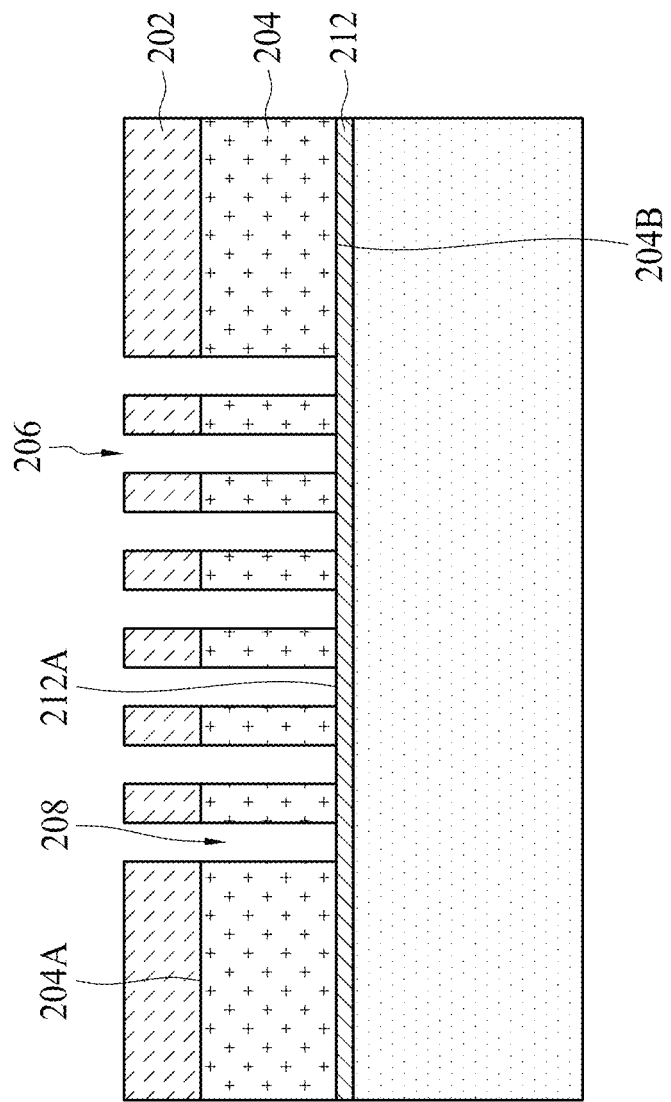

As depicted in FIG. 1, the method 100 continues with operation 155 in which an intensity of an emission light generated by a reaction of a plasma and a product produced in operations 170 is detected. For example, the intensity of the emission light is detected by using an optical emission spectroscopy (OES) technique described below. Then the method 100 continues with operation 160 in which an endpoint in patterning the substrate is determined according to the intensity of the emission light generated by the reaction of the plasma and the product. If the endpoint is not determined, the method 100 proceeds from operations 130 to 150 (i.e., Bosch process 170) repeatedly until desired trench depth is reached. In some embodiments, the endpoint is reached when the substrate 204 is etched through to expose the recess 203 (FIG. 2E). In some alternative embodiments, the endpoint is reached when an interface 212A between the substrate 204 and the etching stop layer 212 is exposed (FIG. 3E), or when a required trench depth is reached. This successive cycle is widely used to achieve high aspect ratio (for example, up to 20:1), extremely high aspect ratio (for example, up to 100:1), or high etch rate (for example, up to 20 microns per minute) etching of silicon microstructures used throughout the MEMS industry. For example, the structure with the recess 203 under the trenches 208 shown in FIG. 2E can be used as a movable element or a suspending element of the MEMS devices such as a spring, a proof mass, or other structures. After the Bosch process, the trench 208 with vertical sidewall or nearly a vertical sidewall is formed in the substrate 204. However, in some other embodiments, a trench with v-shaped or any other sidewall surface geometry may be formed, and the process conditions for forming the trench may vary widely depending on the desired aspect ratio and etch rate.

Figure 4:
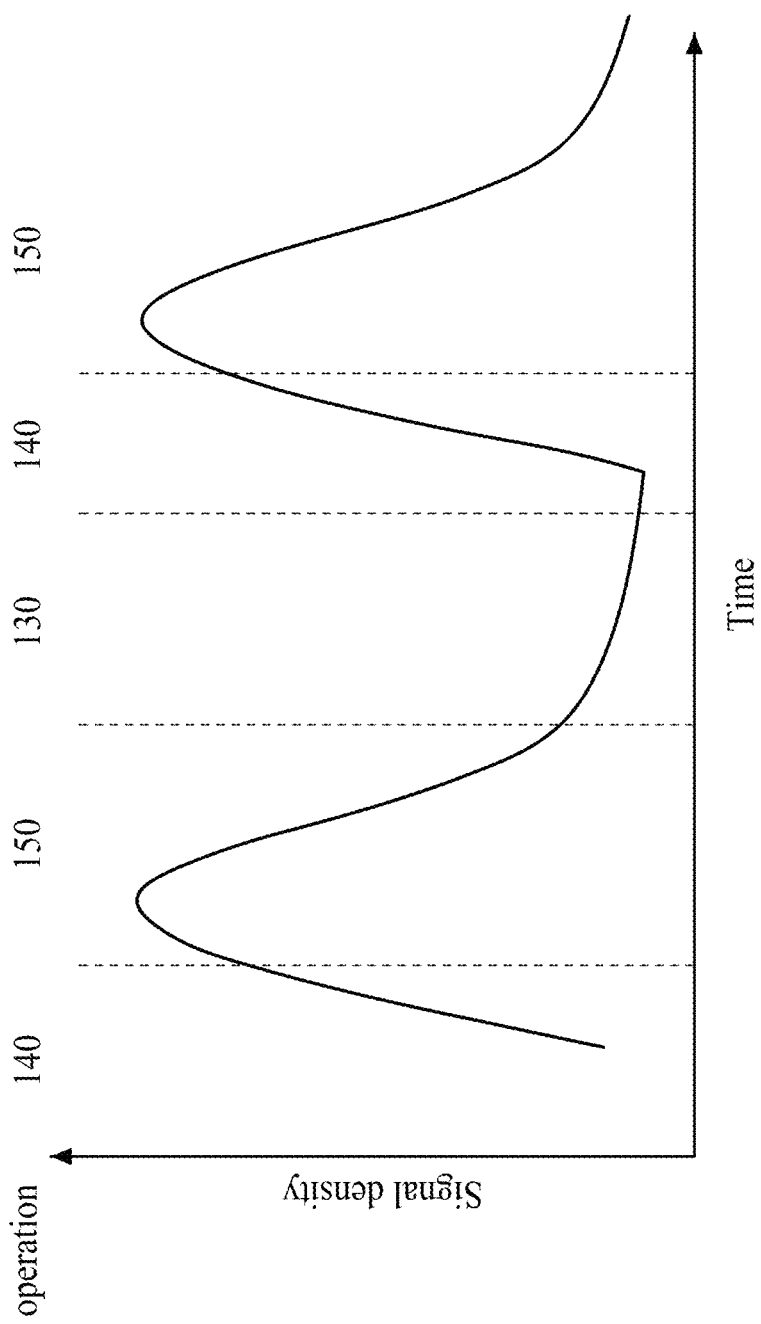
FIG. 4 is a schematic view of OES signals of CFx varied in Bosch process in accordance with some embodiments of the present disclosure.

In some examples, the Bosch process is terminated after performing a fixed number of process cycles. However, this method may lead to over etching or under etching because the endpoint cannot be accurately determined. In order to control the dimension and profile of the trench, it is important to accurately detect the endpoint during the process. In some embodiments, operation 155 is carried out by using an optical emission spectroscopy (OES) technique to monitor in-situ plasma process conditions, so that the intensity of the emission light generated by the reaction of the plasma and the product produced operation 170 can be detected. The OES technique involves measuring optical emission of the plasma (for example, electrons in the plasma) in the UV and visible (about 200 nm to 1000 nm) range with different wavelengths corresponding to different elements and radicals produced from each operation of the Bosch process (operation 170). The optical emission of the plasma varies with the amount of product produced from operation 170. If the amount of product decreases, the intensity of OES signals of the plasma corresponding to the amount of product also decreases. In some embodiments shown in FIG. 2E, when the substrate 204 is etched through and the recess 203 is exposed, the amount of product generated by the reaction of the plasma and the material of the substrate 204 stops increasing. In some other embodiments shown in FIG. 3E, when the interface 212A between the substrate 204 and the etching stop layer 212 is etched, the amount of product generated by the reaction of the plasma and the material of the etching stop layer 212 begins increasing. As depicted in FIG. 4, the graph shows a schematic view of OES signals of CFx (which is produced from operation 140) varied in the successive cycle of the Bosch process in accordance with some embodiments of the present disclosure.

Figure 5:
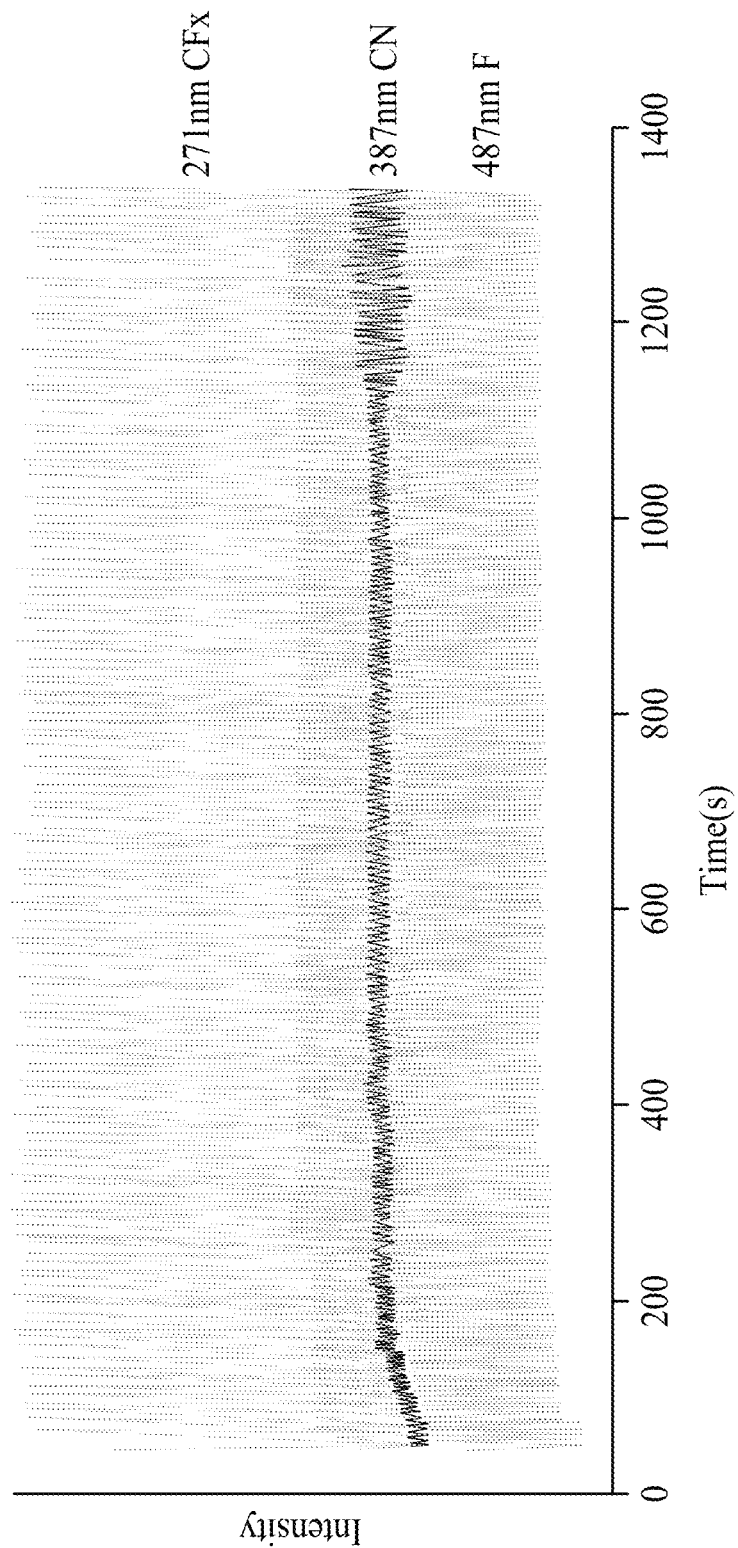
FIG. 5 is a graph illustrating the intensity of OES signals of the plasma varying with time in accordance with some embodiments of the present disclosure.

However, in a real situation shown in FIG. 5, the endpoint cannot be easily found because the rapid switch among operations 130 to 150 in the Bosch process may cause a complex signal variation. The duration of each operation is adjustable to suit particular needs. In some embodiments, the duration of each operation may be in a range from 0.2 sec to 10 sec. As can be seen in FIG. 5, curves showing the intensity of received OES signals have significant variations and are difficult to be interpreted.

FIGS. 3A to 3E are cross-sectional views at one of various operations of manufacturing a trench structure according to some embodiments of the present disclosure. FIGS. 3A to 3E provide another embodiment, in which an etching stop layer 212 is formed on a second surface 204B of the substrate 204, and the substrate 204 is patterned from a first surface 204A to form a trench 208. In some embodiments, the endpoint is determined when the etching stop layer 212 is exposed.

It is appreciated that FIGS. 2A to 2E and FIGS. 3A to 3E are merely examples and not intended to limit the structure in which the Bosch process is applied.

To alleviate this challenge, the present disclosure provide three methods capable of monitoring in-situ plasma condition and finding the endpoint of the Bosch process: (1) increasing the sampling rate when detecting the intensity of an emission light generated by a reaction of a plasma and a product; (2) determining the endpoint according to the signals in one of the operations; or (3) applying a smooth function to process signals. Each of the above methods can make it easier to detect the endpoint. In some embodiments, two of these three methods or all of these three methods can be combined wherever necessary.

Method (1) increases the sampling rate. Due to a rapid switch among the operations, signals received may not be able to respond to the process correctly. Increasing the sampling rate allows more sampling points to be received in a period of time, and thus the accuracy of OES signals of the plasma can be improved. In some other embodiments, the sampling rate used in method (1) may be ranged from 1 pt/20 μs to 1 pt/100 μs such as 1 pt/50 μs. However, other suitable sampling rates can also be used.

Method (2) determines the endpoint based on the signals in one of operations 130, 140 and 150, but not in all of operations 130, 140 and 150. The purpose of acquiring signals in only one operation is to exclude the unnecessary signals and make the curve easier to interpret. In some embodiments, signals found in operation 130 can be used. However, signals found in only operation 140 or 150 can also be used. Using OES signals produced in a single operation allows an exclusion of unnecessary signals and makes the intensity of received OES signals to become clear and easier to interpret.

Method (3) applies a smooth function to process the signals so that the signals are easier to interpret. Method (3) may be implemented by any suitable smooth functions. Smooth functions can reduce the variations between signals and produce a relatively smooth curve so that an endpoint can be found easily. In some embodiments, a simple moving average (SMA) algorithm may be applied. For example, the average value of every n (for example, n=3) consecutive signal sampling points is used as a representative value. When calculating successive representative values, a new successively obtained signal sampling point comes into the sum and the old signal sampling point drops out. More specifically, if 100 sampling points are found, the signal function can be obtained by using the average value of the 1st, 2nd, and 3rd sampling points as a 1st representative value, the average value of the 2nd, 3rd, and 4th sampling points as a 2nd representative value, and so on. In some other embodiments, any other suitable smooth functions can be used to process the signal. In some other embodiments, a weighted moving average (WMA) algorithm, Exponential Moving Average (EMA) algorithm or any other suitable smooth algorithms can be used.

Figure 6:
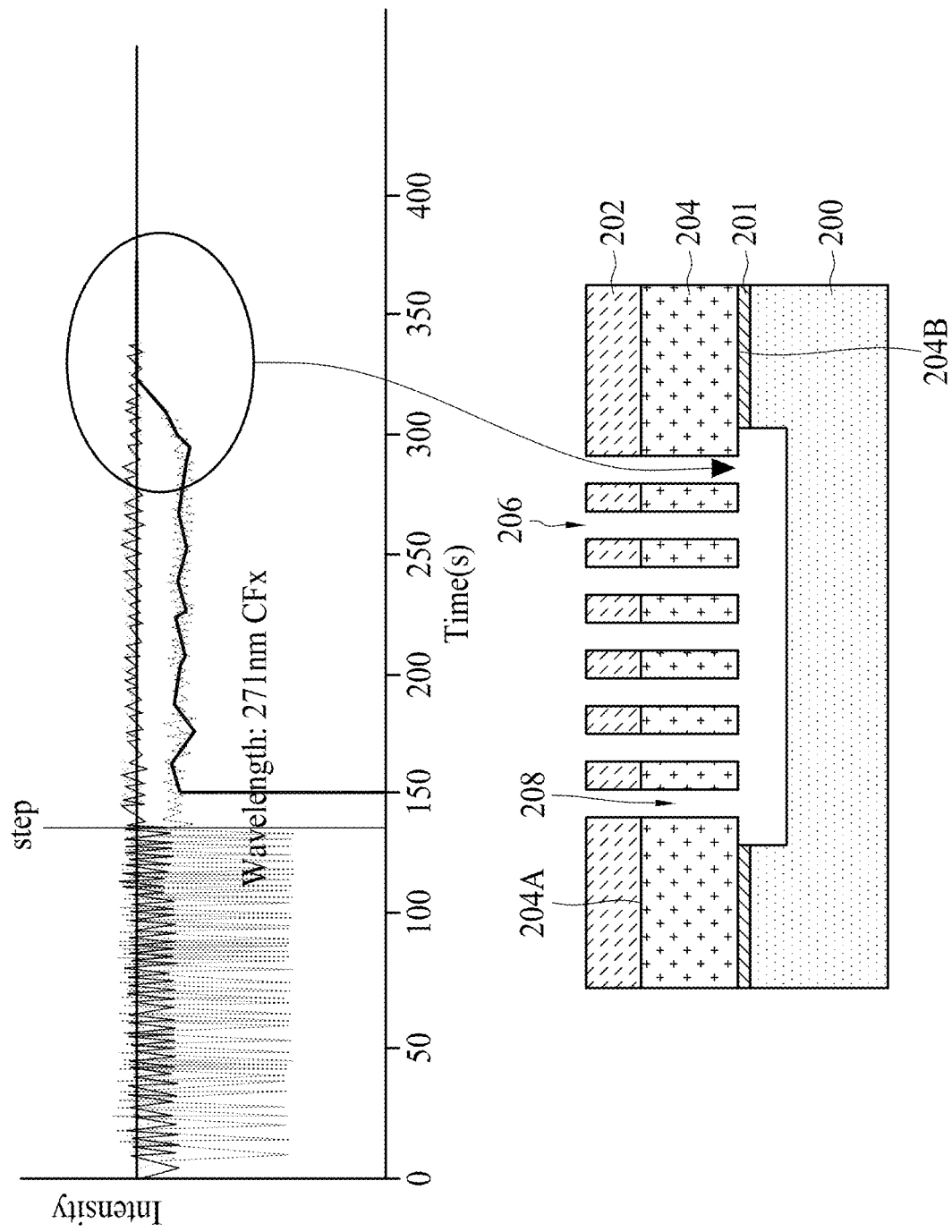
FIG. 6 is a graph illustrating the intensity of OES signals of the plasma varying with time in accordance with some embodiments of the present disclosure.

FIGS. 5 and 6 are graphs illustrating the intensity of OES signals of the plasma varying with time in accordance with some embodiments of the present disclosure. As depicted in FIG. 6, a graph shows the result when method (1), (2), and (3) are applied to the signals detected in the Bosch process, while as depicted in FIG. 5 a graph shows the original result when neither method (1), (2), and (3) is applied. In some embodiments, the duration of operation 130 is 0.5 sec, the duration of operation 140 is 0.4 sec, and the duration of operation 150 is 0.5 sec. The duration of each operation, for example, may be ranged from 0.2 sec to 10 sec, and may be the same or different. In some embodiments, $SF_6$ gas is provided as the etch gas for operation 130 and 150, and $C_4F_8$ is provided for operation 140, but not limited thereto. In some embodiments, the self-bias in operation 150 is higher than that in operation 130.

FIG. 5 illustrates the curves of the intensity of OES signals. By using the OES technique, specific ion species and radicals corresponding to their optical emission wavelengths are observed. In some embodiments, CFx (with the wavelength of about 271 nm), CN (with the wavelength of about 387 nm) and F (with the wavelength of about 487 nm) which are produced in the Bosch process are observed, and their optical emission intensities are monitored in operation 155. However, in some other embodiments, any suitable product varying with the switching process can also be used for monitoring. The sampling rate used in FIG. 5 is 1 pt/200 µs (collect 1 sampling point per 200 microseconds). All signals produced in operation 130, 140, and 150 are drawn in the graph and no smooth function is applied to the signals.

By contrast, FIG. 6 illustrates the curves which method (1), (2), and (3) are applied. To implement method (1), a sampling rate of 1 pt/50 µs (collect 1 sampling point per 50 microseconds) is used. The sampling rate is increased to 4 times faster than that in FIG. 5. Thus, the switch among operation 130, 140, and 150 is very fast (0.5 sec, 0.4 sec and 0.5 sec respectively), and the increased sampling rate allows more sampling points to be received in a period of time so that the accuracy of the OES signals of the plasma is improved and able to respond to the process correctly. To implement method (2), only signals produced in operation 130 are drawn in the graph. The reason for using signals produced in a single operation is to exclude the unnecessary signals, thus the curves may become clear and easier to interpret. To implement method (3), a simple moving average algorithm is applied to the CFx signals. In FIG. 5, the average value of every 3 consecutive signal sampling points is used as a representative value to calculate the signals so that the original intensity curve is smoothed.

As can be seen in FIGS. 5 and 6, curves shown in 5 have significant variations which are difficult to be interpreted. By contrast, curves shown in FIG. 6 are easily interpreted curves. When the intensity converges to a relatively stable value, it implies that the substrate 204 is etched through and the variations of the amount of CFx, CN and F slow down or stop. Accordingly, the endpoint is determined.

It is appreciated that the three methods do not necessary need to be used in combination. Each of the three methods can be individually used to make it easier to determine the endpoint in the Bosch process.

In some embodiments, only method (1) is used to find the endpoint in the Bosch process. To implement method (1), the sampling rate is increased to 1 pt/50 µs, but is not limited thereto. In some embodiments, the sampling rate used in method (1) may be ranged from 1 pt/20 µs to 1 pt/100 µs. By applying the faster sampling rate in the monitoring process, more sampling points are received. Thereby, the sampling error caused by a rapid switch among operations 130, 140, and 150 (for example, 0.5 sec, 0.4 sec and 0.5 sec respectively) may be alleviated. Thus, the curves of the intensity of received signals become easier to interpret.

In some embodiments, only method (2) is used to find the endpoint in the Bosch process. To implement method (2), only signals produced in operation 130 are used to draw the curve. Any product varying with the switching process can be considered as the observation object. For example, the OES signals of CFx, CN, F or other suitable products can be observed. Selecting signals only produced in one operation helps to clarify the complex patterns of the curves.

In some embodiments, only method (3) is used to find the endpoint in the Bosch process. To implement method (3), a simple moving average algorithm is applied to reduce the variations between signals and draw relatively smoothed curves immediately; thus, an endpoint can be observed easily. In some embodiments, the average value of every 4 consecutive signal sampling points is used as a representative value to calculate the signals so that the original intensity curve is smoothed. In some embodiments, other suitable smooth functions can also be applied.

Using only one of above methods can make the curve become easy to interpret. Furthermore, in some embodiments, the combination of any two of these methods can allow the endpoint in the Bosch process to be found easily.

Figure 7:
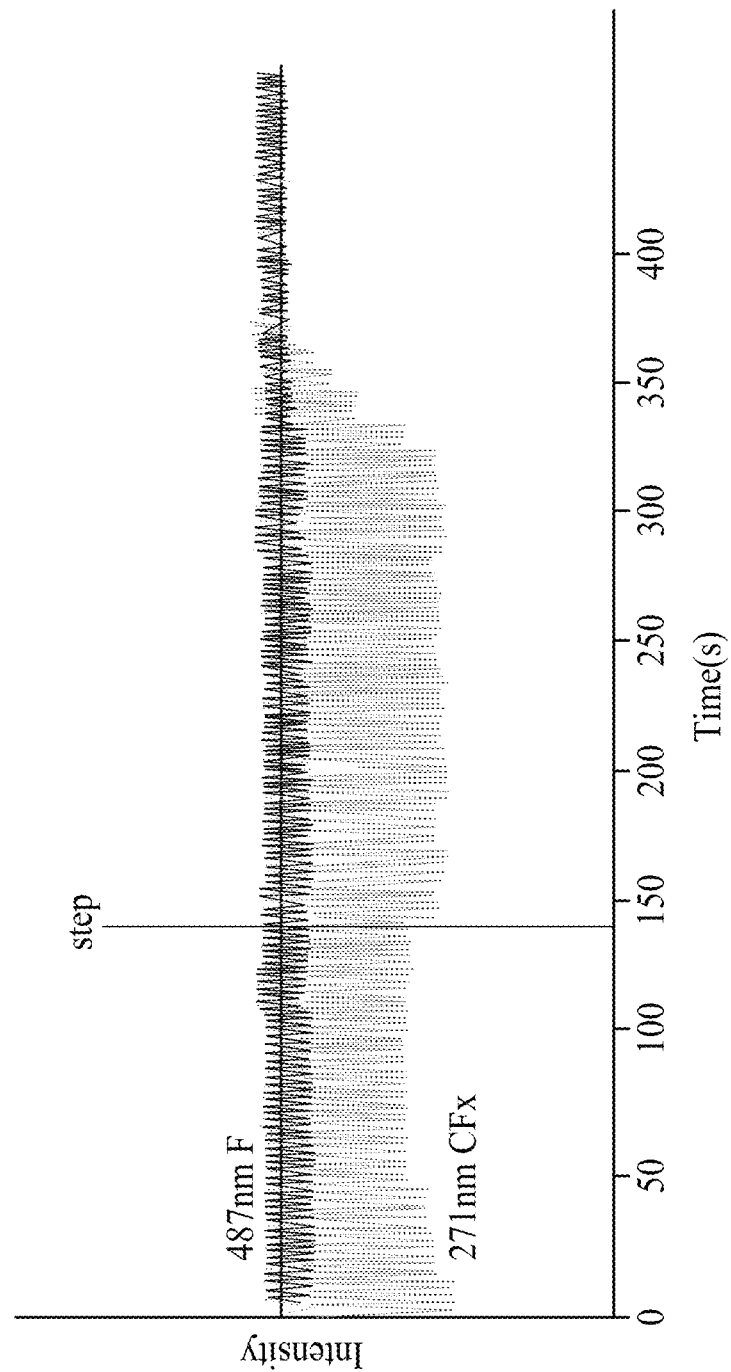
FIG. 7 is a graph illustrating the intensity of OES signals of the plasma varying with time in accordance with some embodiments of the present disclosure.

In some embodiments depicted in FIG. 7, methods (1) and (2) are used to find the endpoint in the Bosch process. To implement method (1), the sampling rate may be ranged from 1 pt/20 µs to 1 pt/100 µs. In some embodiments, the sampling rate is about 1 pt/50 µs. To implement method (2), only signals produced in operation 130 are used. In some other embodiments, signals produced in operation 140 or 150 can also be used. As can be seen in FIG. 7, the endpoint in the Bosch process can still be found when the intensity of CFx signals converge to a stable value.

In some embodiments, methods (1) and (3) are used to find the endpoint in the Bosch process. To implement method (1), the sampling rate may be ranged from 1 pt/20 µs to 1 pt/100 µs. In some embodiments, the sampling rate is about 1 pt/50 µs. To implement method (3), a smooth function such as simple moving average algorithm is applied to process the signals to calculate the representative value of every 3 consecutive signal sampling points. In some other embodiments, the representative value may be calculated from every 4 consecutive signal sampling points, every 5 consecutive signal sampling points, or any suitable consecutive signal sampling points.

In some embodiments, methods (2) and (3) are used to find the endpoint in the Bosch process. To implement method (2), only signals produced in operation 130 is used. In some other embodiments, signals produced in operation 140 or 150 can also be used. To implement method (3), a simple moving average algorithm is applied to process the signals to calculate the representative value of every 3 consecutive signal sampling points. Alternatively, the representative value may be calculated from every 4 consecutive signal sampling points, every 5 consecutive signal sampling points, or any suitable consecutive signal sampling points.

In one exemplary aspect of the present disclosure, a method of manufacturing a semiconductor device is provided. The method comprises the following operations. (a) A substrate is patterned. (b) A polymer layer on the patterned substrate is formed. (c) The polymer layer is patterned. Steps (a), (b) and (c) are repeated alternatingly. An intensity of an emission light generated by a reaction of a plasma and a product produced in steps (a), (b) and (c) is detected. A sampling rate of the intensity is substantially ranged from 1 pt/20 μs to 1 pt/100 μs. An endpoint in patterning the substrate is determined according to the intensity of the emission light generated by the reaction of the plasma and the product.

In another exemplary aspect of the present disclosure, a method of manufacturing a semiconductor device is provided. The method comprises the following operations. (a) A substrate is patterned. (b) A polymer layer on the patterned substrate is formed. (c) The polymer layer is patterned. Steps (a), (b) and (c) are repeated alternatingly. An intensity of an emission light generated by a reaction of the plasma and a product produced in steps (a), (b) and (c) is detected. An endpoint in patterning the substrate is determined according to the intensity of the emission light generated by the reaction of the plasma and the product produced in only one step of steps (a), (b) and (c).

In yet another exemplary aspect of the present disclosure, a method of manufacturing a semiconductor device is provided. The method comprises the following operations. (a) A substrate is patterned. (b) A polymer layer on the patterned substrate is formed. (c) The polymer layer is patterned. Steps (a), (b) and (c) are repeated alternatingly. An intensity of an emission light generated by a reaction of a plasma and a product produced in steps (a), (b) and (c) is detected. A smooth function is used to process the intensity of the emission light generated by the reaction of the plasma and the product. An endpoint in patterning the substrate is determined according to the intensity of the emission light generated by the reaction of the plasma and the product processed by the smooth function.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    receiving a substrate attached to an intermediate layer disposed on a carrier substrate, wherein a recess is defined within the substrate, the intermediate layer, and the carrier substrate;
    after the receiving, patterning the substrate;
    forming a polymer layer on the patterned substrate;
    patterning the polymer layer;
    alternatingly repeating the patterning the substrate, the forming the polymer layer, and the patterning the polymer layer;
    detecting an intensity of an emission light generated by a reaction of a plasma and a product produced during the patterning the substrate, the forming the polymer layer, and the patterning the polymer layer, wherein a sampling rate of the intensity ranges from about one sampling point per 20 microseconds to about one sampling point per 100 microseconds; and
    determining an endpoint in patterning the substrate according to the intensity of the emission light generated by the reaction of the plasma and the product during the patterning the substrate, the forming the polymer layer, or the patterning the polymer layer, wherein the endpoint indicates that the patterning the substrate has passed through the substrate to the recess defined within the substrate, the intermediate layer, and the carrier substrate.

2. The method of claim 1, wherein the endpoint in patterning the substrate is determined according to the intensity of the emission light generated by the reaction of the plasma and the product produced during the patterning the substrate.

3. The method of claim 1, wherein the endpoint in patterning the substrate is determined according to the intensity of the emission light generated by the reaction of the plasma and the product produced during the forming the polymer layer.

4. The method of claim 1, wherein the endpoint in patterning the substrate is determined according to the intensity of the emission light generated by the reaction of the plasma and the product produced during the patterning the polymer layer.

5. The method of claim 1, wherein:
    the patterning the substrate includes removing portions of the substrate to form a trench;
    the forming the polymer layer includes depositing the polymer layer along sidewalls and a bottom surface of the trench; and
    the patterning the polymer layer includes removing the polymer layer from the bottom surface of the trench.

6. The method of claim 5, wherein:
    the patterning the substrate further includes forming a patterned masking layer over the substrate.

7. A method of manufacturing a semiconductor device, comprising:
    patterning a silicon substrate in a first phase, wherein the silicon substrate is attached to a carrier substrate by an intermediate layer and a cavity is defined within the silicon substrate, the intermediate layer, and the carrier substrate;
    forming a fluorocarbon-based polymer layer on the patterned silicon substrate in a second phase;
    patterning the fluorocarbon-based polymer layer in a third phase;
    alternatingly repeating the first phase, the second phase, and the third phase, wherein a duration of each of the first phase, the second phase, and the third phase ranges from about 0.2 seconds to about ten seconds;
    detecting an intensity of an emission light generated by fluorocarbons during the first phase, the second phase, and the third phase, wherein a sampling rate of the intensity ranges from about one sampling point per 20 microseconds to about one sampling point per 100 microseconds; and
    determining an endpoint in patterning the silicon substrate according to the intensity of the emission light generated by the fluorocarbons during the first phase, wherein the endpoint indicates that a trench extends through an entire thickness of the silicon substrate to expose the cavity defined within the silicon substrate, the intermediate layer, and the carrier substrate.

8. The method of claim 7, wherein the duration of each of the first phase, the second phase, and the third phase is about 0.5 seconds.

9. The method of claim 7, wherein the duration of the first phase is about 0.5 seconds, the duration of the second phase is about 0.4 seconds, and the duration of the third phase is about 0.5 seconds.

10. The method of claim 7, wherein the duration of the first phase is longer than the duration of the second phase and the duration of the third phase is longer than the duration of the second phase.

11. The method of claim 7, wherein:
the patterning the silicon substrate includes forming a patterned masking layer over the silicon substrate, wherein the patterned masking layer exposes a portion of the silicon substrate, and
etching the exposed portion of the silicon substrate.

12. The method of claim 7, wherein:
the patterning the silicon substrate includes removing portions of the silicon substrate to form the trench;
the forming the fluorocarbon-based polymer layer includes depositing the fluorocarbon-based polymer layer along sidewalls and a bottom surface of the trench;
the patterning the fluorocarbon-based polymer layer includes removing the fluorocarbon-based polymer layer from the bottom surface of the trench; and
the patterning the silicon substrate, the forming the fluorocarbon-based polymer layer, and the patterning the fluorocarbon-based polymer layer are alternatingly repeated until the trench extends through the silicon substrate.

13. A method of manufacturing a semiconductor device, comprising:
attaching a first surface of a first substrate to an intermediate layer disposed on a second substrate, wherein a portion of the second substrate is recessed away from the first surface of the first substrate, such that a recess is defined within the first substrate, the intermediate layer, and the second substrate;
after attaching the first surface of the first substrate to the intermediate layer disposed on the second substrate, performing a patterning cycle having a duration of about 0.2 seconds to about ten seconds, wherein the patterning cycle includes:
etching the first substrate to form a trench, wherein the etching is directed to a second surface of the first substrate that is opposite the first surface,
depositing a polymer layer on sidewall surfaces and a bottom surface of the trench, and
etching the polymer layer from the bottom surface of the trench;
detecting an intensity of an emission light generated by a reaction of a plasma and a product produced during the patterning cycle, wherein the intensity is measured at 100 microseconds or less intervals;
using a smooth moving average function to generate successive intensity measurements representing the intensity of the emission light generated by the reaction of the plasma and the product, wherein each successive intensity measurement is generated from a set of successive sampling points; and
repeating the patterning cycle until the successive intensity measurements generated by the smooth moving average function indicate that the trench extends from the second surface of the first substrate to the first surface of the first substrate, thereby exposing the recess defined within the first substrate, the intermediate layer, and the second substrate.

14. The method of claim 13, wherein the smooth moving average function is used to process the intensity of the emission light generated by the reaction of the plasma and the product produced during the etching of the first substrate.

15. The method of claim 13, wherein the smooth moving average function is used to process the intensity of the emission light generated by the reaction of the plasma and the product produced during the etching of the polymer layer.

16. The method of claim 13, wherein the smooth moving average function is used to process the intensity of the emission light generated by the reaction of the plasma and the product produced during the etching of the polymer layer.

17. The method of claim 13, wherein the smooth moving average function includes a moving average algorithm that generates each intensity measurement by averaging at least two consecutive intensity measurements.

18. The method of claim 1, wherein a side surface of the intermediate layer forms a first portion of a sidewall of the recess.

19. The method of claim 18, wherein a side surface of the carrier substrate forms a second portion of the sidewall of the recess.

20. The method of claim 1, wherein a portion of the substrate is disposed over the recess.

* * * * *